United States Patent [19]

Birt

[11] 4,213,103
[45] Jul. 15, 1980

[54] CIRCUIT FOR DETECTING AND CONTROLLING SIMULTANEOUS CONDUCTION OF TWO SWITCHES CONNECTED IN SERIES

[75] Inventor: David R. Birt, Oxted, England

[73] Assignee: Communications Patents Limited, London, England

[21] Appl. No.: 904,413

[22] Filed: May 10, 1978

[30] Foreign Application Priority Data

Jun. 9, 1977 [GB] United Kingdom ............. 24179/77
Jul. 12, 1977 [GB] United Kingdom ............. 50844/77
Sep. 26, 1977 [GB] United Kingdom ............. 39971/77

[51] Int. Cl.² .................... H03K 7/10; H02M 7/48
[52] U.S. Cl. .................................. 332/9 T; 375/22; 332/10; 363/56; 363/98; 363/132
[58] Field of Search .............. 332/9 R, 9 T, 14, 10; 325/38 R, 42, 141, 142; 331/113 A, 113 S; 363/17, 26, 56, 58, 98, 132, 136

[56] References Cited

U.S. PATENT DOCUMENTS

| | | | |
|---|---|---|---|
| 3,737,755 | 6/1973 | Calkin et al. | 363/17 |
| 3,783,304 | 1/1974 | Fox | 325/142 X |
| 3,859,583 | 1/1975 | Reed | 363/26 |
| 3,859,586 | 1/1975 | Wadlington | 363/56 |
| 4,126,819 | 11/1978 | Stobbe et al. | 363/56 X |

Primary Examiner—Siegfried H. Grimm
Assistant Examiner—Edward P. Westin
Attorney, Agent, or Firm—Laurence R. Brown

[57] ABSTRACT

A switching system is described for use in for example AM transmitters comprising at least one pair of semiconductor output switches connected in series across an AM modulated D.C. supply and arranged to be operated sequentially by a series of "on" and "off" command signals to energize a load, such as an antenna. The circuitry provides a delay interval between the "off" command to any one switch and the "on" command to the next switch in the sequence. Means are provided for detecting when two successive switches in the sequence conduct simultaneously, and means are provided for increasing the duration of the delay interval when such simultaneous conduction is detected.

14 Claims, 26 Drawing Figures

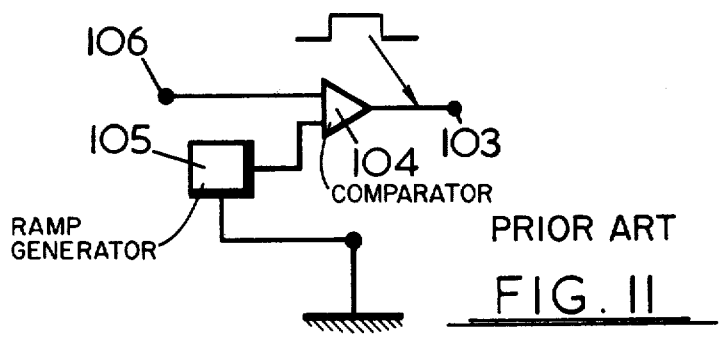
PRIOR ART
FIG. 11
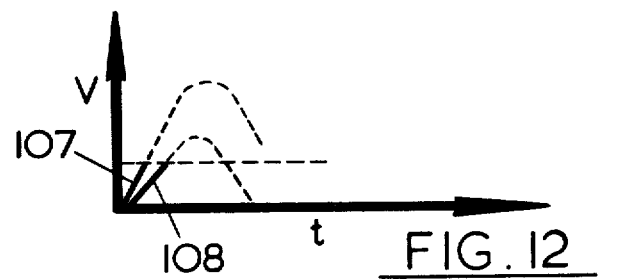
FIG. 12
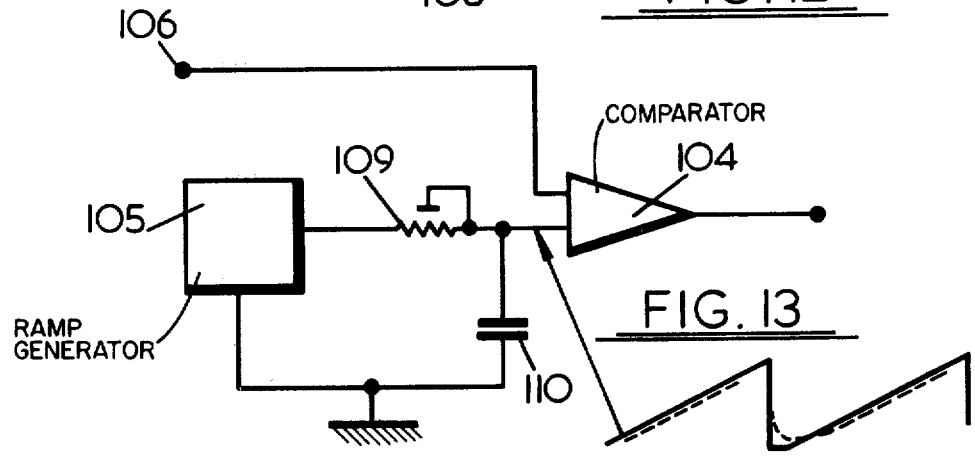
FIG. 13
FIG. 14
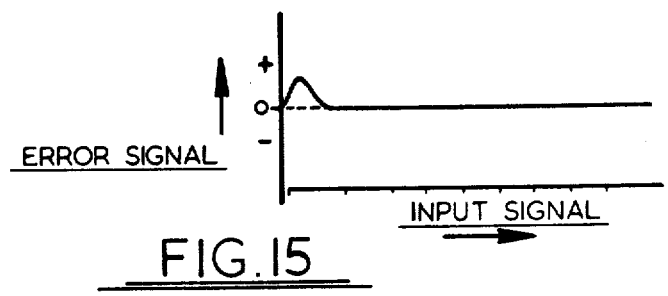
FIG. 15

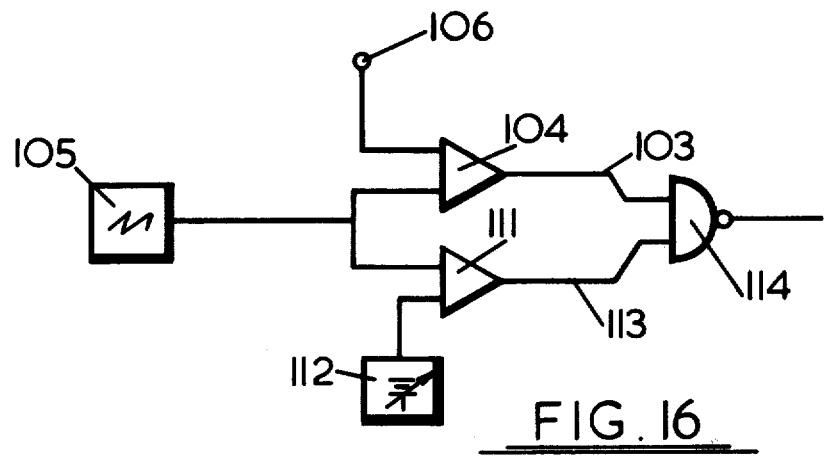
FIG. 16
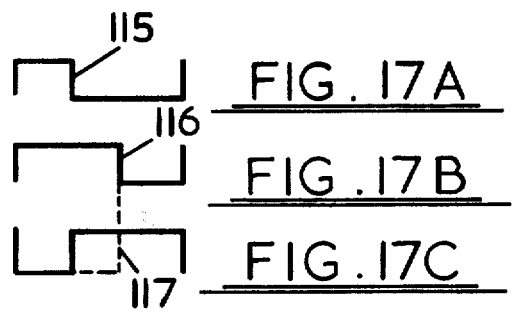
FIG. 17A
FIG. 17B
FIG. 17C
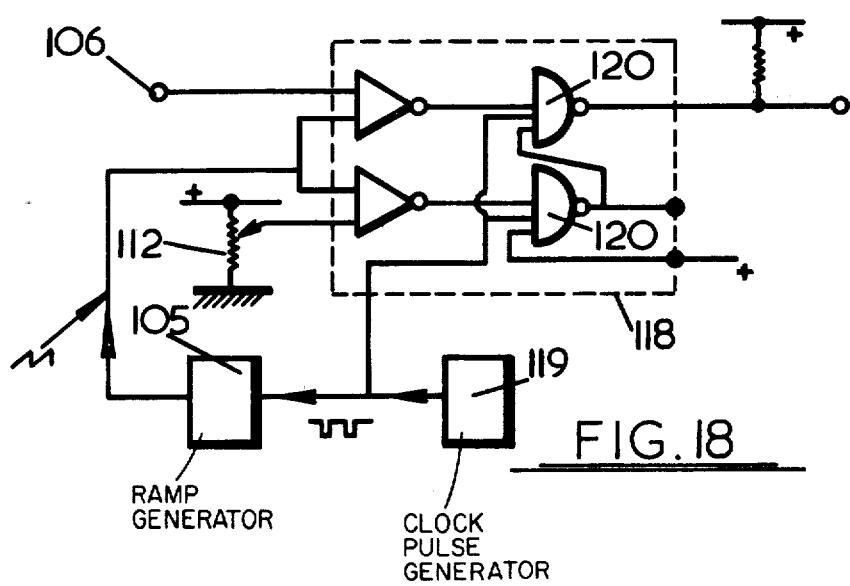
FIG. 18
RAMP GENERATOR
CLOCK PULSE GENERATOR

CIRCUIT FOR DETECTING AND CONTROLLING SIMULTANEOUS CONDUCTION OF TWO SWITCHES CONNECTED IN SERIES

This invention relates to electronic switching systems, and in particular to such systems in which a plurality of semi-conductor switches are arranged to be operated sequentially.

A known example of such a system is a simple D.C. to A.C. converter in which at least one pair of semi-conductor switches is connected across a D.C. supply with the switches in series. The outputs of the switches are connected and co-operate to produce a rectangular voltage waveform from the D.C. source. When one switch of the pair is in its conductive state, the other switch in the pair is in its nonconductive state, and vice-versa. It is essential that the two switches are not simultaneously fully conductive, as if they were a short circuit path across the D.C. source.

Semi-conductor switches are generally controlled by a square-wave which provides alternate "on" and "off" commands. The response to "on" and/or "off" commands is however not instantaneous. For example, if the switches are transistors, there is exhibited a delay time, td, between an "on" command and the initiation of the main current through the transistor. Likewise there is a storage time, ts, between an "off" command and the interruption of the main current. The storage time ts is usually appreciably longer than the delay time td and is a variable both between transistors of the same nominal type, and as a function of main current and operating temperature.

It is known to incorporate a delay interval in the respective control waveforms whereby the "on" command to one switch is delayed by a fixed interval from the "off" command to the previously conducting switch, the fixed delay being greater than or equal to ts−td. This technique is satisfactory in a situation where the predicted maximum storage time ts and the predicted variations in storage time are short compared with the "on" period of the switch. A typical application of this kind is an inverter circuit operating at 20 KHz with a constant load and employing transistors with storage times of 1 $\mu$S which are short compared with the half-period of 25 $\mu$S.

In high frequency applications however the storage time can be comparable to the "on" period of the switch. Variations in storage time then become highly significant, and the use of a fixed delay is no longer acceptable.

It is an object of this invention to provide for an automatically adjusted delay period.

According to the present invention there is provided a switching system comprising at least one pair of semi-conductor switches connected in series across a D.C. supply and arranged to be operated sequentially by a series of "on" and "off" command signals to energize a load, and means for providing a delay interval between the "off" command to any one switch and the "on" command to the next switch in the sequence, characterized in that means are provided for detecting when two successive switches in the sequence conduct simultaneously, and for increasing the duration of the delay interval when such simultaneous conduction is detected.

Preferably, the "on" and "off" command signals are provided by a switching signal generator circuit comprising a switching signal generator, a logic circuit and a pulse generator, the outputs of the switching signal generator and the pulse generator being applied to the logic circuit, respective outputs of which are applied to the pair of semi-conductor switches, and the pulse generator providing pulses the widths of which are responsive to the simultaneous conduction detection means.

The semi-conductor switches may be arranged in the output stage of an amplitude modulated transmitter, each switch being controlled by a driver stage. For example, the semi-conductor switches may comprise two pairs of transistors connected in a bridge configuration across the D.C. source, one transistor of each pair receiving command signals via a first driver circuit and the other transistors receiving command signals via a second driver circuit.

It is well known in transistor transmitters to modulate both the output stage and the driver stages in order to obtain satisfactory linearity of the modulated output. If only the output stage is modulated, even when the transistor collector-emitter voltage is zero considerable "leak through" of the applied carrier wave occurs so that the troughs of the modulated output are distorted relative to the peaks. Thus the output stage usually has full modulation applied to it while the driver stage has only a portion of the full modulation applied to it, most commonly through networks of resistors and diodes or from a tap on the main modulation transformer.

The above-mentioned components are fixed and therefore adjustments to the modulation linearity of individual systems are not possible. In consequence the quality of the systems has varied from one to another in dependence upon the spread of component characteristics. Proposals have been made to overcome these problems, for example by using matched sets of transistors for the various stages, but these proposals are costly to implement in production and have not proved satisfactory.

In accordance with the present invention, the auxiliary modulator comprises a modulating transistor having a control terminal which receives signals from the main modulator, said modulating transistor being supplied from two independently controllable sources of potential which may be controlled to determine the peak and trough auxiliary modulation points. Thus individual systems can be adjusted as necessary to ensure linear modulation.

It would be possible to sense simultaneous conduction in systems according to the invention using circuits including diode clamps but such circuits are temperature sensitive. Accordingly the means for detecting simultaneous conduction preferably comprise means for sensing current drawn from the D.C. supply through the switches, means for sensing current drawn through the load, and means for comparing the sensed currents to detect differences between them which differences are representative of simultaneous conduction. Preferably means are provided for full wave rectifying the output of the load current sensing means, means for subtracting the rectified output and the output of the supply current sensing means one from the other, and a transistor having a control terminal connected to receive the output of the subtracting means.

An embodiment of the present invention will now be described, by way of example, with reference to the accompanying drawings, in which:

FIG. 7 illustrates a simultaneous conduction detector;

FIG. 11 is a schematic diagram of a known circuit for providing a pulse width modulated signal;

FIG. 12 illustrates the voltage waveform across a main switching element driven by the circuit of FIG. 11;

FIG. 13 illustrates a modified ramp generator/comparator circuit;

FIG. 14 illustrates the effect of the modification shown in FIG. 13 on the ramp generator output;

FIG. 15 illustrates the input signal/output signal error relationship with and without the modification of FIG. 13;

FIG. 16 is a schematic diagram of a modification of the circuits of FIGS. 11 and 13;

FIGS. 17A, 17B and 17C illustrate waveforms appearing in the circuit of FIG. 16; and FIG. 18 illustrates details of the circuit according to FIG. 16.

Figure 1:
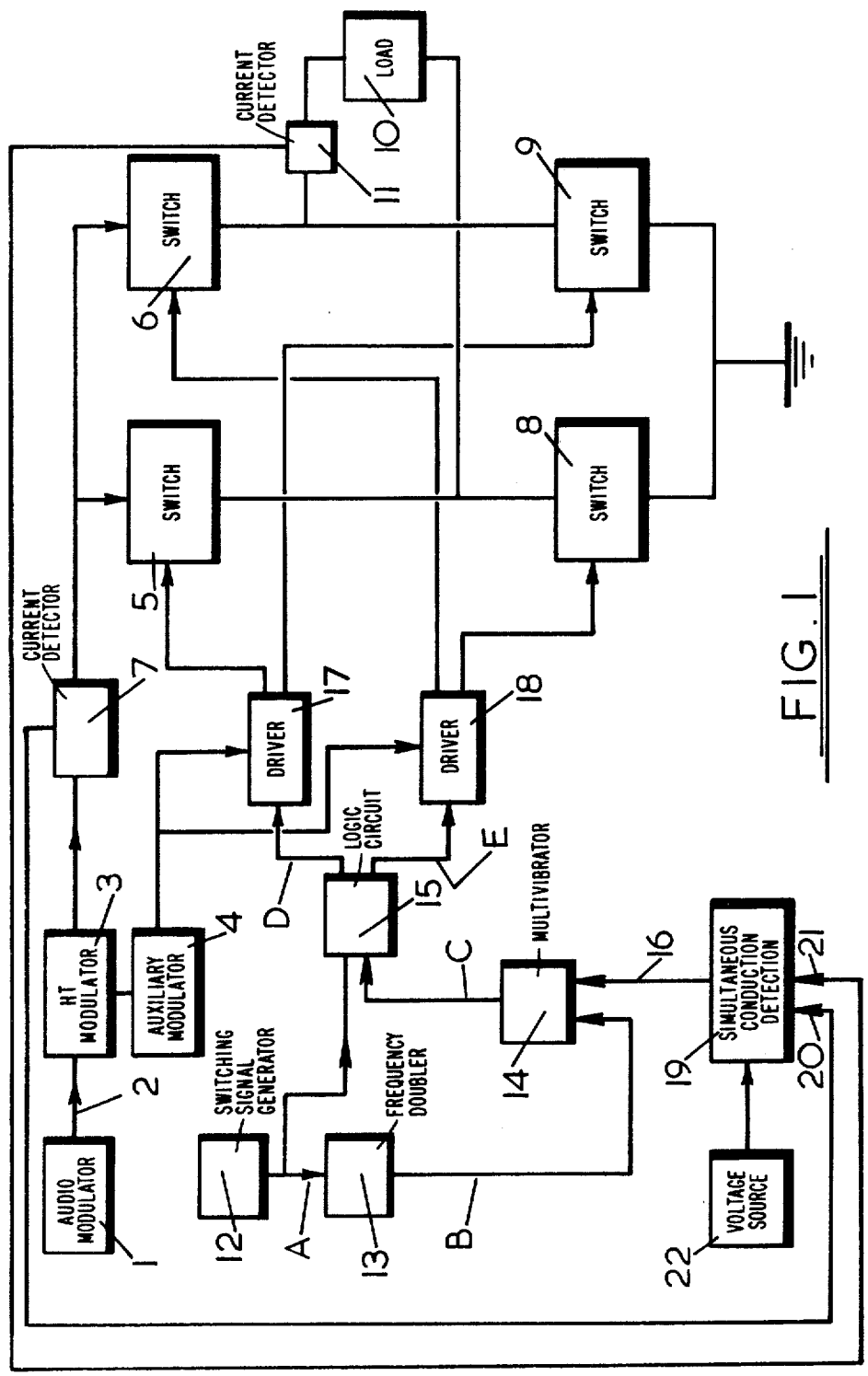
FIG. 1 is a schematic block diagram of an AM transmitter according to the invention.

FIG. 1 is a schematic diagram of an RF transmitter comprising an audio modulator 1 providing a pulse width modulated audio input 2 to a main HT (high tension) modulator 3. An auxiliary modulator 4 is also provided. The main modulator 3 provides an HT output modulated by the pulse width modulated input 2 to transistor switches 5, 6 via a current detecting circuit 7 the purpose of which is described below. The switch 5 is connected in series with a further switch 8, and the switch 6 is connected in series with a further switch 9. The switches 5, 6, 8 and 9 thus form a power amplifier of bridge form.

If switches 5 and 9 are turned on and switches 6 and 8 are turned off, current is drawn from the output of modulator 3 to ground via switch 5, a load 10, a further current detecting circuit 11 and switch 9. If switches 6 and 8 are turned on and switches 5 and 9 are turned off, current is drawn from the output of modulator 3 to ground via switch 6, circuit 11, load 10 and switch 8, i.e. the direction of current flow is reversed. As the output of modulator 3 operates essentially as a AM voltage source the amplitude of which is representative of the audio input, the output load (i.e. an antenna) transmits an AM modulated signal at a frequency controlled by the switching frequency of the switches 5, 6, 8 and 9.

Figure 2:
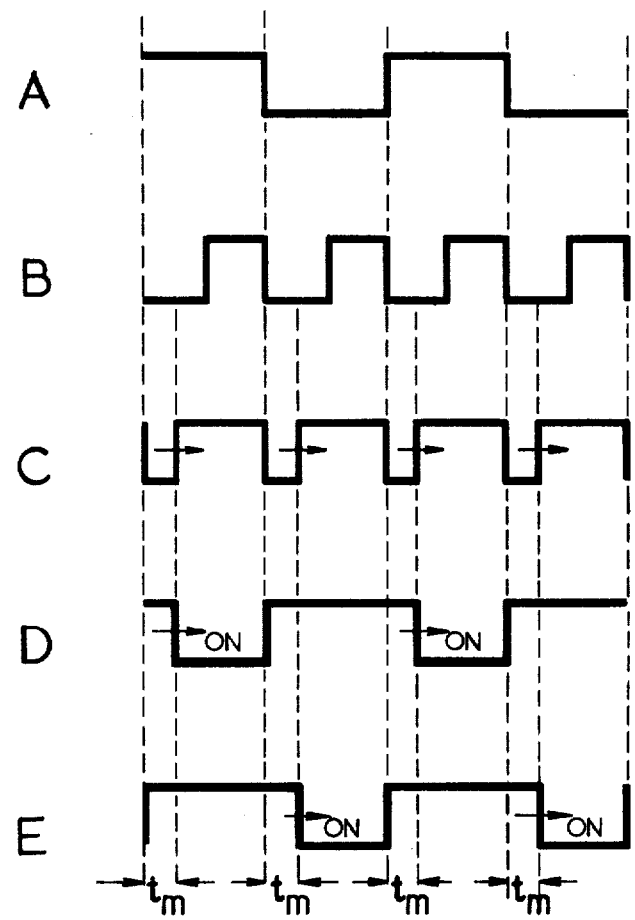
FIGS. 2 and 3 illustrate waveforms appearing in the transmitter of FIG. 1.

The switches 5, 6, 8 and 9 are operated at an r.f. frequency determined by a switching signal generator 12 which provides an r.f. square wave output A as shown in FIG. 2A. The output A is doubled in frequency by unit 13 to provide output B (FIG. 2B) which is applied to a pulse generator in the form of a monostable multivibrator 14. The multivibrator 14 provides an output C (FIG. 2C) to a logic circuit 15 which also receives input A (FIG. 2A) from source 12, the mark space ratio of the pulses of output C being dependent upon input 16 to the multivibrator 14 as will be described hereinafter. The signal A (FIG. 2A) applied to the logic circuit 15 acts as a synchronizing signal to ensure that, in a transmitter which includes many modules of the type illustrated operating in parallel, all of the modules operate in phase.

The logic circuit 15 provides outputs D (FIG. 2D) and E (FIG. 2E) to respective driver stages 17 and 18 for the switches 5, 6, 8 and 9, each of the outputs D and E comprising portions at logic "0" which correspond to periods during which it is desired to turn on the switches controlled by the respective drivers 17 and 18. The drivers 17, 18 receive an auxiliary modulation input from modulator 4. The drivers 17, 18 amplify the logic level pulses at the output of logic circuit 15 to a level sufficient to drive the switches 5, 6, 8 and 9. It will be seen that there is a delay period of length tm between the turning off of one set of switches (FIG. 2D) and the turning on of the other set (FIG. 2E). This is to compensate for the combined effects of the delay time between an "on" command to a switch and the initiation of main current through the transistor and the storage time between an "off" command and the interruption of the main current.

The length of the delay period tm is controlled by the input 16 to the multivibrator 14. The input 16 is in turn controlled by a simultaneous conduction detection circuit 19 which receives inputs from detection circuits 7 and 11.

Figure 3:
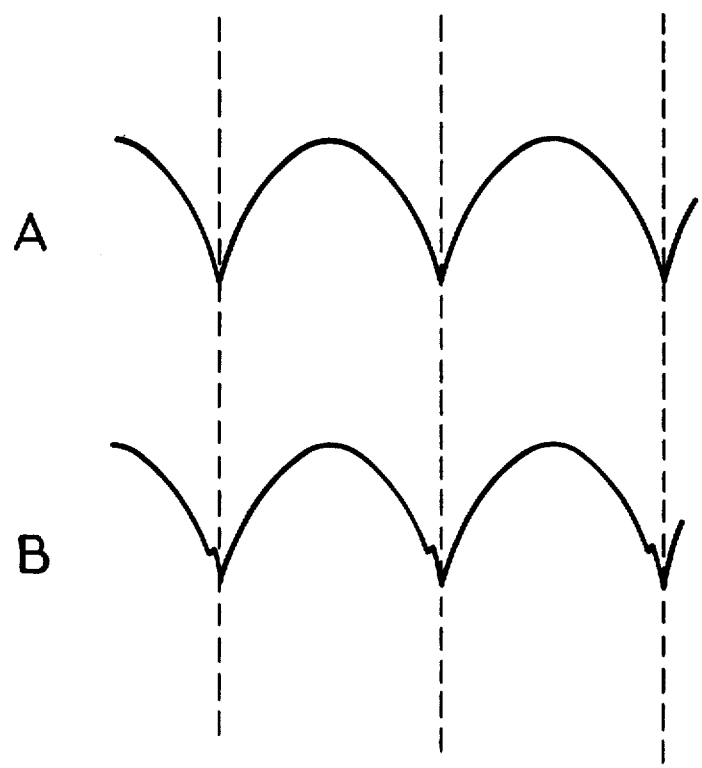

The detection circuit 7 provides an input waveform 20 to circuit 19 which is representative of the combined collector currents of the switches 5, 6, 8 and 9. Ideally this is a cusp waveform (FIG. 3A), but in the event of simultaneous conduction of switches 5 and 8 or 6 and 9 the cusp waveform is modified by the addition of narrow spikes at the switching transitions (FIG. 3B).

The detection circuit 11 provides an input waveform 21 to the circuit 19 which is representative of the load current. The waveform 21 is full wave rectified to provide a true cusp waveform which is not influenced by simultaneous conduction and does not contain any spikes as these do not appear in the load current. The spikes cannot appear in the load current in any event as the load is resonant.

The circuit 19 subtracts its rectified input 21 from its input 20. The result of this subtraction is zero if there is no simultaneous conduction in the switches and in such circumstances the input 16 to the multivibrator 14 is held at a reference level determined by a voltage source 22. If there is simultaneous conduction however the result of the subtraction is not zero and the input 16 is modified accordingly to increase the width of the pulses (FIG. 2C) provided by the multivibrator. Thus the delay tm between the application of "on" command pulses to the switches is increased to automatically adjust the condition of the circuitry to stop the simultaneous conduction.

The voltage source 22 also limits the maximum pulse width of the multivibrator output to prevent the pulse width exceeding one half cycle of the carrier frequency determined by signal A (FIG. 2A).

Figure 4:
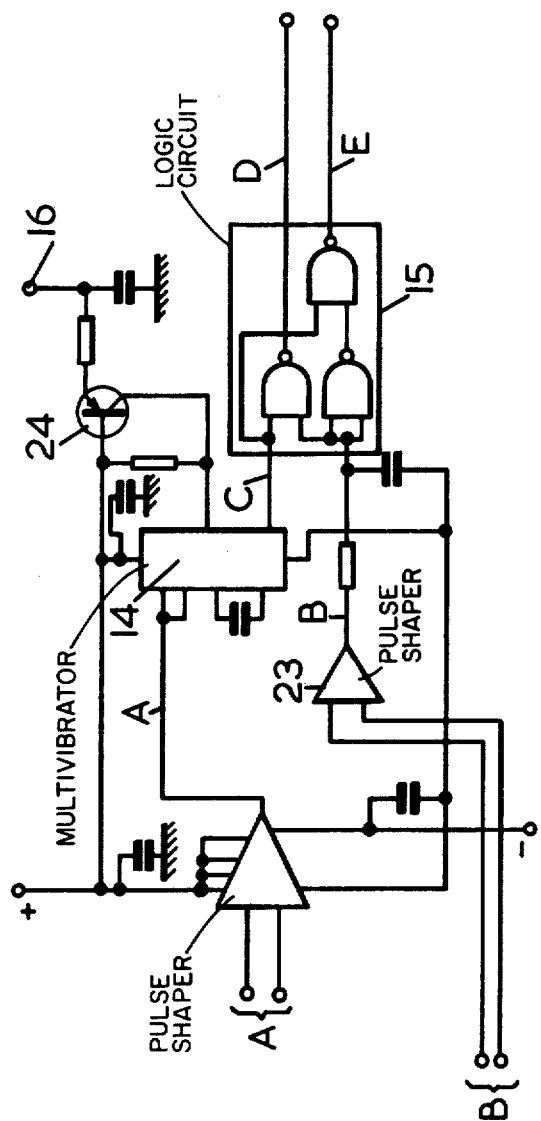
FIG. 4 illustrates circuit details of switching control signal generating circuitry.

Referring now to FIG. 4, details of components 14 and 15 of FIG. 1 are shown. The multivibrator 14 and logic circuit 15 receive inputs A and B via identical pulse shaping circuits 23. The multivibrator is controlled by input 16 via transistor 24. The logic circuit 15 comprises three NAND gates as shown providing outputs D and E in known manner.

Figure 5:
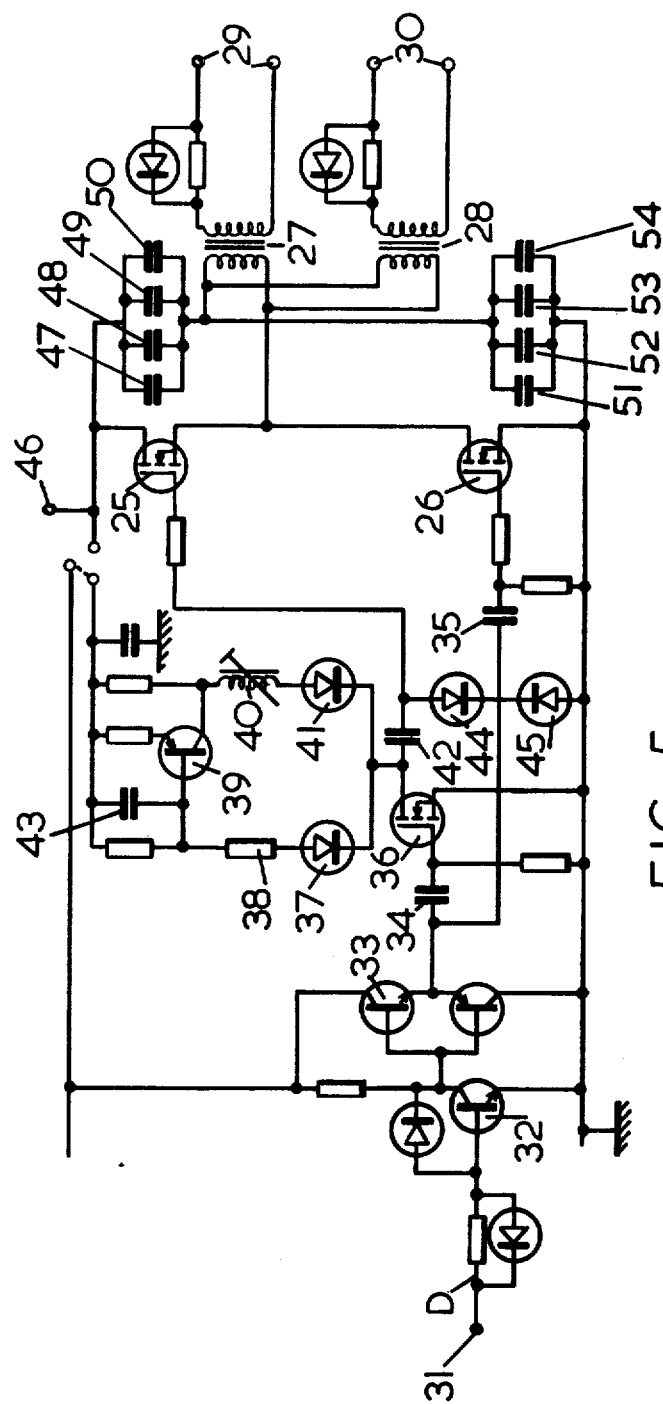
FIG. 5 illustrates an output driver stage.
Figure 5A:
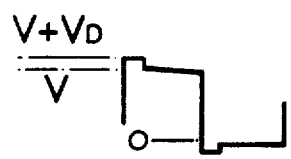
FIGS. 5A to 5F illustrate waveforms appearing in the driver stage of FIG. 5.
Figure 5B:
Figure 5C:
Figure 5D:
Figure 5E:
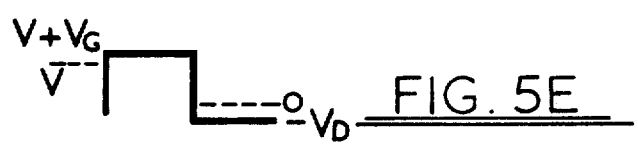
Figure 5F:
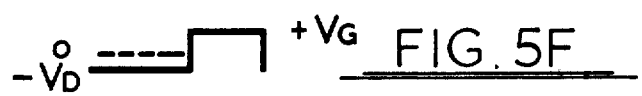

FIG. 5 shows details of the driver 17 of FIG. 1. Forward and reverse base drive is provided to the power switches 5, 6, 8 and 9 (FIG. 1) by a pair of identical half-bridge switching stages employing VMOS field effect transistors (FETs) 25, 26. Each of the FETs 25, 26 is capable of switching for example two amps in typically 5 nS. There is a separate coupling transformer 27, 28 coupling the driver to each of the output power switches via terminals 29, 30. Each half-bridge driver feeds the two coupling transformers 27, 28 in parallel. The transformers 27, 28 have a ratio of 2:1 voltage step down, and employ double bifilar windings to minimize leakage inductance.

The FETs 25, 26 conduct by majority carriers and therefore there is no storage time, and hence no possibility of simultaneous conduction if they are driven by straight forward antiphase gate signals. This is a major advantage, and allows very simple gate drive circuitry.

The FETs 25, 26 are of the normally off enhancement mode N-channel type, and require for example +10 volts gate-to-source voltage to turn them on fully. Thus the gate voltage of the upper transistor 25 of the half bridge needs to be driven above the drain supply rail by 10 volts. This is achieved by exploiting the very high gate resistance of the F.E.T.

The presence of stray inductances results in energy storage which modifies the current waveform such that the transistors 25 and 26 are required to conduct bilaterally if the desired output waveform is to be obtained. Drain current flows in the reverse direction when the transistors are turned on, generally through semiconducting junctions in the transistors 25 and 26.

FIGS. 5A to 5F respectively show the output voltage waveform, the load current, the drain currents of transistors 25 and 26, and the gate drives applied to these transistors. The output voltage (FIG. 5A) is shown to exceed the limits of the supply voltage by a voltage $V_D$ during drain current reversal. The gate drive to transistor 25 (FIG. 5E) is a rectangular wave which rises to a voltage of $V+V_G$ to provide the positive gate to source potential required to turn transistor 25 on, and which falls to a voltage of $-V_D$ to ensure that the transistor 25 turns off even when an inductive load causes the source terminal to go negative by an amount equal to $V_D$.

The circuit of FIG. 5 operates in the following way. Assume a logic low (OV) input at terminal 31. Transistor 32 is off, transistor 33 is on. As a result, a positive transition is transmitted via coupling capacitors 34, 35 to drive the gates of transistors 36 and 26 positive so that these transistors are on. Transistors 26 supplies the load current, turning on the appropriate switch in the power amplifier bridge. Transistor 36 activates a current path via diode 37 and resistor 38 to turn on a current source transistor 39. The collector current of transistor 39 flows in the path of inductor 40, diode 41 and transistor 36 (drain-source). Transition to low voltage at the drain of transistor 36, being coupled via capacitor 42 to the gate of transistor 25, holds that transistor off. Energy stored in inductor 40 is proportional to the current attained at the end of the on period of transistor 36. At the end of this period terminal 31 goes to logic high, and consequently transistors 36 and 26 are turned off. Diode 37 turns off, transistor 39 "hangs on" due to the charge on capacitor 43. Current from inductor 40 continues, and the stored energy is transferred into the combined capacitance of capacitor 42 and the input capacitance of transistor 25. The voltage at the gate of transistor 25 rises as a near-quarter sinewave transition at the resonant frequency of inductor 40 and the total capacitance, until clamped by the diodes 44 and 45. Capacitor 42 acquires a small charge as a result of the left to right current flow. The gate of transistor 25 is thus driven positive with respect to the maximum supply rail voltage. Since the gate resistance is very high and the leakage current low, the time constant of this resistance and the input capacitance is long compared to the on period of transistor 25. The gate therefore stays charged until transistor 25 is turned off again. Taking the lowest frequency as 500 kHz, the on time of transistor 25 is a maximum of 1 µS.

When the input at terminal 31 reverts to logic 1, transistor 36 turns on again, and by reason of the charge on capacitor 42, the gate of transistor 25 goes negative until clamped by the substrate diode.

Transformer phasing is such that transistor 25 supplies the reverse suck out base current to turn off the main power switches.

Variation of the characteristics of the power switches driven from terminals 29, 30 results in some variation of the d.c. input impedance of the driver supply rail which is supplied by the auxiliary modulator 4 (FIG. 1) via terminal 46. Capacitive elements 47, 48, 49, 50 and 51, 52, 53 and 54 form part of a low pass filter as will be described below.

Figure 6:
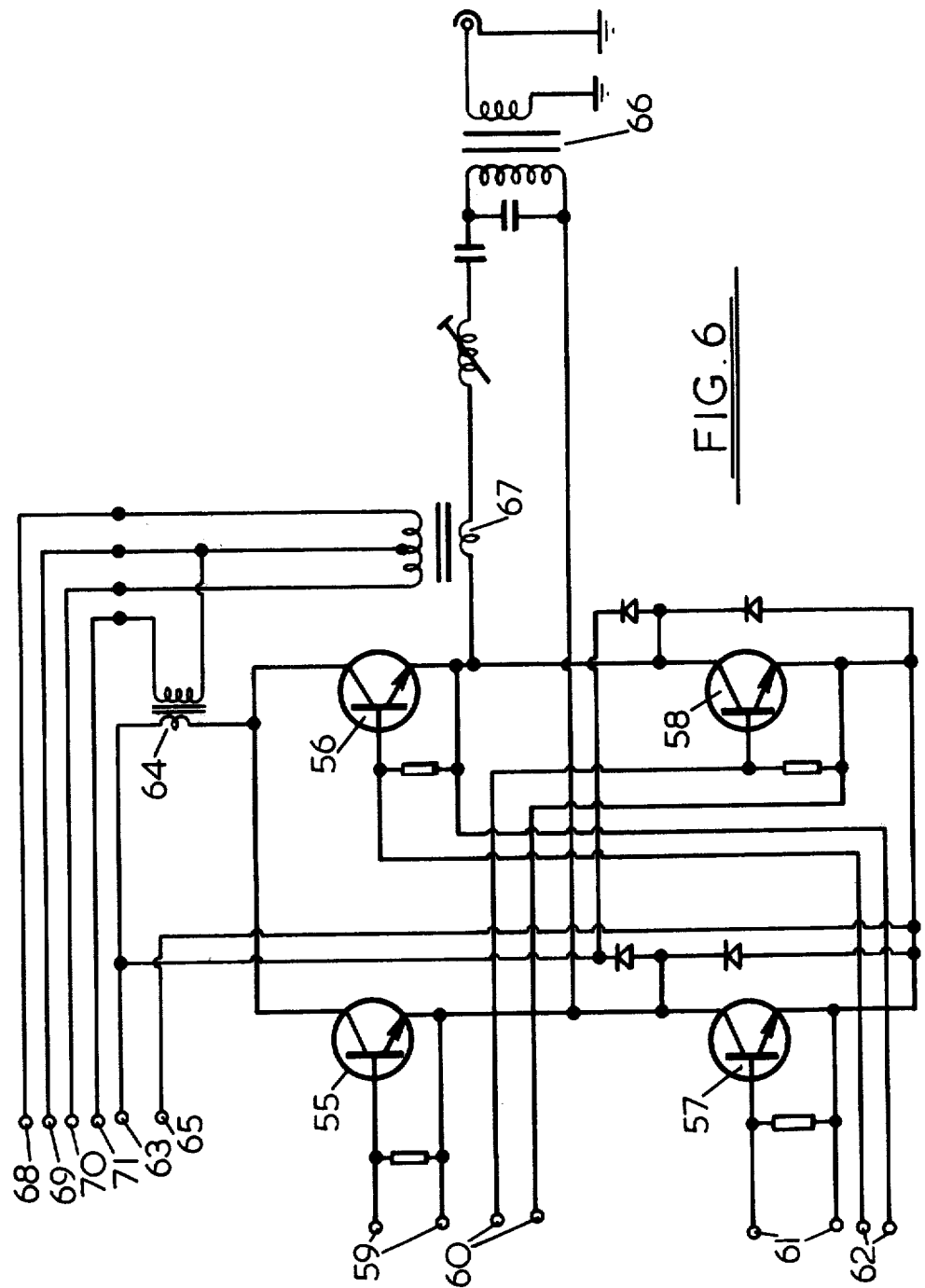
FIG. 6 illustrates a bridge configuration output stage.

FIG. 6 shows details of the PA power amplifier output bridge including four high power output transistors 55, 56, 57 and 58 which correspond to the switches 5, 6, 8 and 9 of FIG. 1. The switching of the output transistors is controlled by the two identical drivers 17, 18 (FIG. 1), the outputs 29 and 30 (FIG. 5) of driver 17 controlling transistors 55 and 58 respectively via inputs 59 and 60 and inputs 61 and 62 provided by driver 18 controlling transistors 56 and 57 respectively.

The modulated DC supply provided by modulator 3 (FIG. 1) is applied to two terminals of the bridge via terminal 63 and transformer 64 which corresponds to current detector 7 (FIG. 1). A connection to the modulator 4 is provided via terminal 65. Current passes to the output load 66 via transformer 67 which corresponds to current detecting circuit 11 of FIG. 1.

The illustrated bridge configuration is advantageous in that the audio frequency component of the modulated d.c. supply does not appear across the r.f. load. Similarly, the impedance of the r.f. load at audio frequencies does not influence the impedance "seen" by the modulator. In addition, the r.f. ripple component in the d.c. supply is at twice carrier frequency which is advantageous in the context of the constraints upon the magnitude of the h.t. decoupling capacitor imposed by the design of the low pass filter of which it is a part.

Outputs 68, 69 70 and 71 are derived from the current detecting transformer 64 and 67 and applied to the simultaneous conduction detector shown in detail in FIG. 7.

The combined collector current of the bridge transistors 55, 56, 57 and 58, which as described above is ideally a cusp waveform but in the event of simultaneous conduction is modified by the addition of narrow spikes at the switching transitions, is represented by the waveform appearing at terminal 71 (FIG. 7). The load current is represented by the waveforms appearing at terminals 68 and 70, which signals are full-wave rectified by diodes 72, 73 to provide a true cusp waveform. This waveform is not influenced by simultaneous conduction of transistor pair 55, 57 or transistor pair 56, 58 and does not contain any spikes.

The collector current and load current representative waveforms are subtracted one from the other across a resistor 74. When there is no cross conduction there is zero potential across this resistor. In the event of simultaneous conduction only the associated current spikes appear across this resistor. These spikes are sampled by transistor 75 which has no forward bias and so is operating in Class 'C' so requiring an input in excess of about 600–700 mV before any variation in collector current occurs. Thus very low level spikes and noise are ignored. The transistor 75 controls the timing of the voltage controlled monostable multivibrator 14 (FIG. 1) in the drive control logic.

The timing of the monostable multivibrator 14 is varied by the transistor 24 (FIG. 4) which is a voltage proportional current source. The D.C. control voltage to transistor 24 is provided from the compound emitter-follower detector output stage formed by transistors 76, 77 (FIG. 7). The input to this emitter follower has a pre-set value determined by the potentiometer 78, the voltage provided by which may be pulled down by the collector current of transistor 75 in response to the simultaneous conduction pulse input applied to its base from across resistor 74. The extent to which this voltage can be pulled down is limited by a pre-set 'end stop' potentiometer 79 which limits the excursion of this voltage to a value such that the pulse provided by the monostable multivibrator does not exceed the width of one half cycle of the particular carrier frequency.

The potentiometer 78 corresponds to the voltage source 22 of FIG. 1.

The detector requires no setting-up and is immune from the effects of temperature variations.

Figure 8:
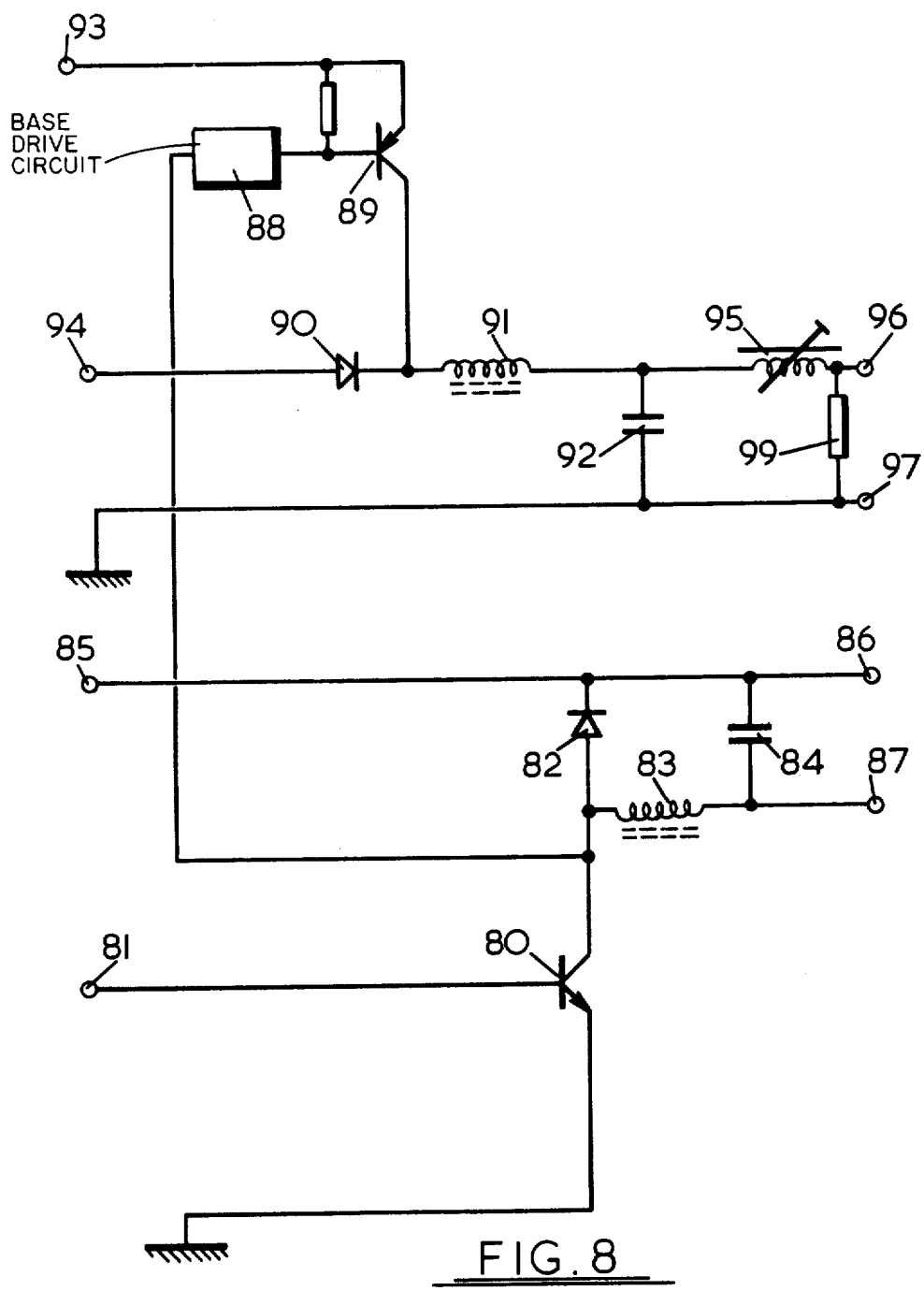
FIG. 8 is a schematic block diagram of a modulator.

The modulation of the output stages of the transmitter will now be described with reference to FIGS. 8, 9 and 10. FIG. 8 is a simplified diagram of circuits shown in detail in FIGS. 9 and 10.

Referring to FIG. 8, the main modulator corresponding to modulator 3 of FIG. 1 comprises a transistor 80 the base of which is driven by a pulse width modulated audio signal via terminal 81. A flywheel diode 82, inductor 83 and capacitor 84 are connected in known manner between the modulation transistor 80 and the positive supply rail 85. Output terminals 86 and 87 are connected to terminals 63 and 65 of the output bridge (FIG. 6).

Square wave pulses appearing at the collector of transistor 80 are applied via a base drive circuit 88 to an auxiliary modulation transistor 89. A flywheel diode 90, inductor 91 and capacitor 92 are again provided but the auxiliary modulation transistor is supplied via terminals 93, 94 with two d.c. reference potentials which can be adjusted when the transmitter is set up. The auxiliary modulator output is passed via adjustable inductor 95 to output terminals 96, 97 which are connected to terminal 46 and the ground rail respectively of the PA drivers 17, 18 (FIGS. 1, 5 and 7).

The potential applied to terminal 94 determines the minimum excursion of the auxiliary modulator output, that is the trough modulation level. The potential applied to terminal 93 determines the peak modulation level. Thus by adjustment of these two potentials the modulation linearity of the transmitter can be adjusted.

The inductor 95 of FIG. 8 forms an element of a low pass filter including capacitive elements 47–54 (FIG. 5). Variations in the characteristics of the output transistors 55–58 (FIG. 6) causes some variation in the d.c. input impedance of the driver supply rail (FIG. 5) which is supplied by the auxiliary modulator. These impedance variations are however made insignificant by a shunt load resistor 99 (FIG. 8) which maintains the termination impedance for the low pass filter.

Figure 9:
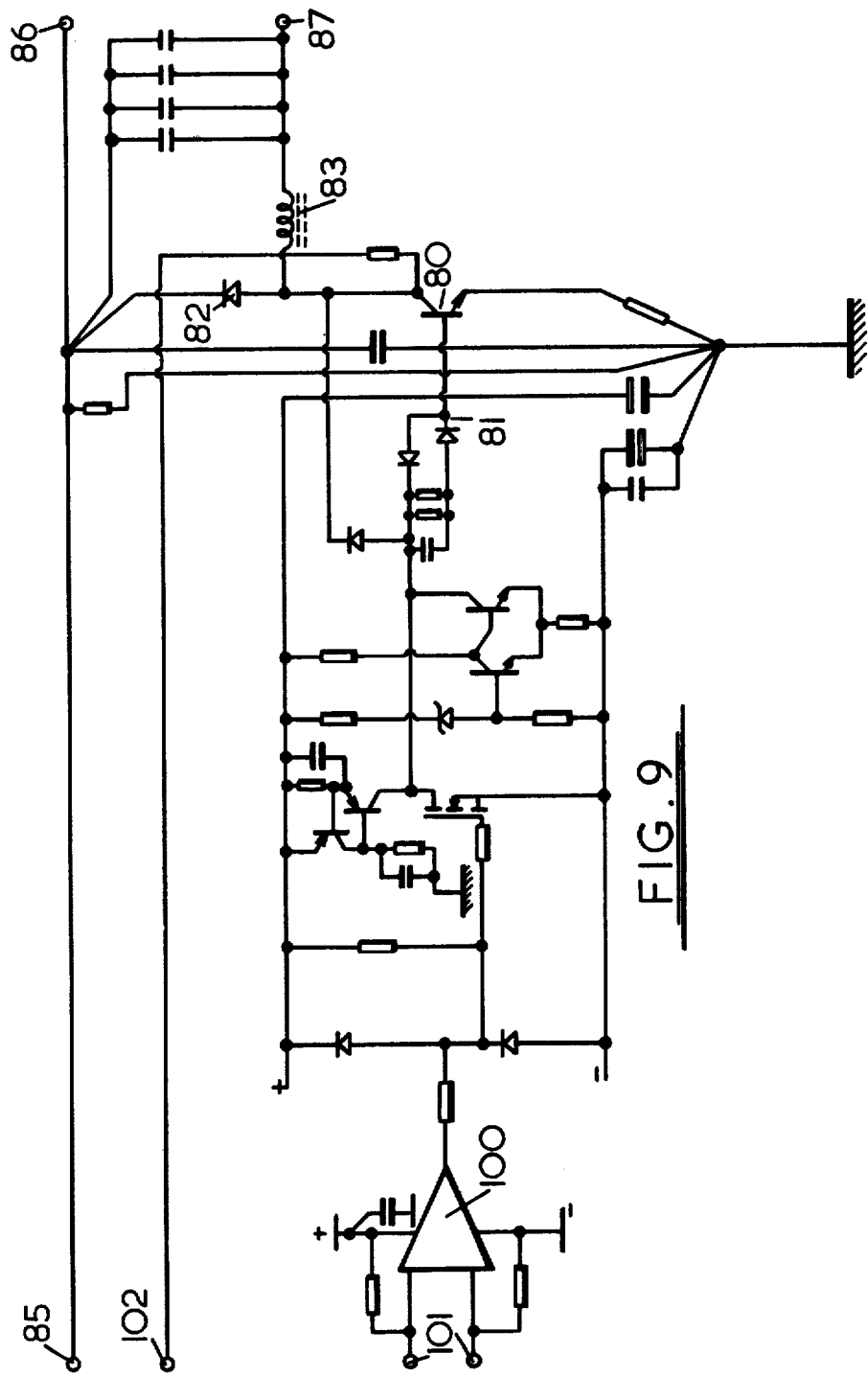
FIGS. 9 and 10 illustrate details of the modulator of FIG. 8.

Referring now to FIG. 9, details of the main modulator shown in the lower half of FIG. 8 are shown. The input to terminal 81 is provided via an integrated circuit 100 from a balanced pulse width modulated audio input line 101. The remaining circuitry of FIG. 9 operates to amplify the pulse width modulated signal to a level such that the output of transistor 80 is appropriate to high level modulation. A signal is passed to the auxiliary modulator via terminal 102.

Figure 10:
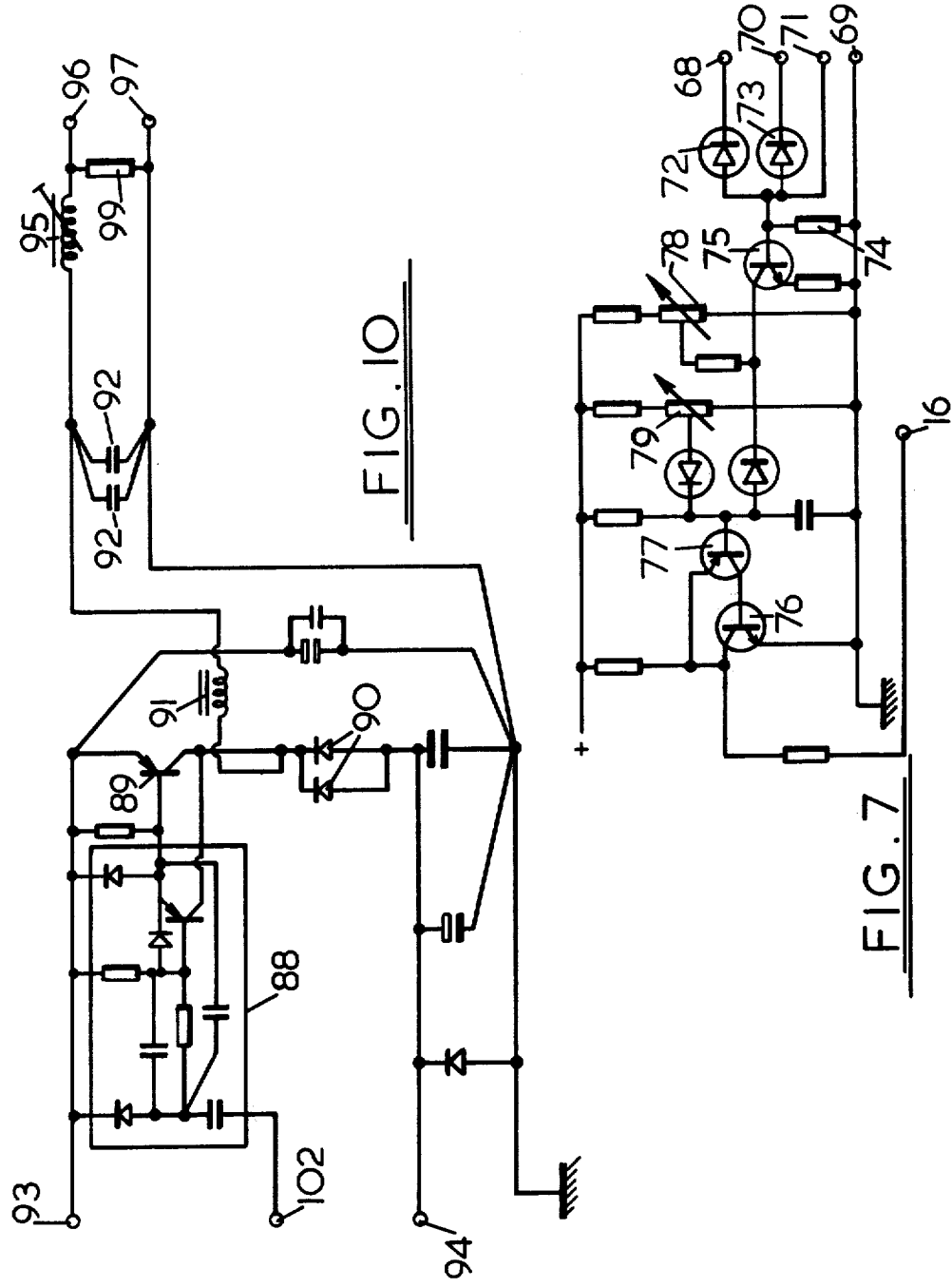

Referring to FIG. 10, details of the auxiliary modulator are shown.

The circuit is basically similar to that of the main modulator of FIG. 9 except that a positive grounded supply system is employed instead of a negative grounded system. This arrangement is more convenient with respect to the coupling of drive signals. In addition the modulator transistor employed is a PNP type to match the supply polarity. It should also be noted that the input signal applied at terminal 102 is AC coupled and then DC restored by means of the rectifier connected between the amplifier side of a capacitor connected to terminal 102 and the supply terminal 93. This form of connection prevents the occurrence of damage to the RF driver stage and auxiliary modulator as a result of failures occurring in the main modulator such, for example, as a collector to emitter short in the transistor 80.

Referring to FIG. 11, the illustrated circuit has an output 103 which is connected to terminal 81 (FIG. 8). The signal at output 103 thus controls transistor 80 (FIG. 8). When the transistor 80 is conductive, current is drawn through the inductor 83. When the transistor 80 turns off, the presence of the inductor 83 causes voltage to build up across the transistor 80 until the flywheel diode 82 is forward biased. The effective output capacitance indicated by capacitor 84 limits the rate at which the voltage across the transistor 80 can rise.

The transistor 80 is controlled by a pulse width modulated signal provided by the circuit of FIG. 11 which comprises comparator 104 receiving inputs from a ramp generator 105 and a signal input terminal 106. The comparator output comprises a series of pulses, the length of each pulse corresponding to the time taken for the ramp generator output voltage to reach the voltage level of the input signal.

Referring to FIG. 12, the voltage build up across transistor 80 (FIG. 8) after the transistor has been turned off is illustrated. The voltage waveform follows a sinusoided locus until clamped by diode 82 to the positive supply rail. Curve 107 illustrates the case of operating at a relatively high power, curve 108 the case of operating at a lower power. The unclamped voltage magnitude is proportional to the instantaneous current in the inductor 83, and therefore the voltage rise-time is inversely proportional to load current. Thus, as the amplifier output signal approaches zero, the rise-time increases and the mean area of the pulse is increased giving an averaged output load voltage which is greater than it should be for a given input signal. Further inaccuracy results from minority carrier storage time in the transistor 80 which becomes significant in the case of a low amplitude output corresponding to a short pulse width.

Referring now to FIG. 13, a modified ramp generator/comparator circuit is shown in which a variable resistor 109 is connected in series between the comparator 104 and the generator 105 and a capacitor 110 is connected between the ramp input to the comparator 104 and ground.

FIGS. 14 and 15 show the result of introducing resistor 109 and capacitor 110. The full line in FIG. 14 illustrates the waveform at the output of generator 105 and the dotted line illustrates the waveform at the ramp input to comparator 104. The full line in FIG. 15 illustrates the error signal in the amplifier output if the generator 105 is connected directly to the comparator 104 and the dotted line illustrates the error signal after the introduction of resistor 109 and capacitor 110.

The described circuit thus enables the transfer characteristic in the near zero region to be simply modified. As a result, an input signal voltage to intermediate pulse width transfer characteristic can be produced which is complementary to the intermediate pulse width to output voltage transfer characteristic of the power switching output stage (FIG. 8).

The circuit of FIG. 13 makes it possible to achieve harmonic distortion below 0.3%. Furthermore when it is desired to reduce the transmitter power output at night time for example, said power reduction can be achieved by attenuating the input level to the modulator without significant degradation of envelope quality.

The facility for transfer characteristic shaping allows also for correction of the modulation characteristics of other parts of the system, e.g. the R.F. power amplifier.

In the circuits of FIGS. 11 and 13, the output 103 of the comparator 104 comprises a series of pulses, the leading and trailing edges of each pulse corresponding respectively to the start and end of a period during which the ramp voltage amplitude is less than that of the input voltage 106. If the input voltage 106 is at or above the peak values of the ramp waveform, the input 106 has no effect on the output 103. Thus the system possesses an inherent limiting characteristic.

Referring now to FIG. 16, means are shown for obtaining a variable limiting threshold. In addition to the ramp voltage generator 105 and comparator 104 a further comparator 111 is provided receiving one input from the generator 105 and a second input from a reference voltage source 112. The comparator 111 provides an output 113 which is applied to a NAND gate 114. The gate 114 also receives the output 103 of the comparator 104.

Referring now to FIGS. 17A, 17B and 17C, the waveform of FIG. 17A appears at the output 103 of comparator 104. The trailing edge 115 of the signal pulse waveform occurs at a time when the ramp waveform from generator 105 and the input signal 106 are amplitude coincident. The waveform of FIG. 17B appears at the output 113 of the comparator 111, the trailing edge 116 of the limit pulse waveform occurring at a time when the ramp waveform from generator 105 reaches a voltage equal to the limit voltage provided by voltage reference 112. Of the two inputs to gate 114, the first transition to zero (trailing edge) has priority in controlling the gate output, so that below the limit threshold the output waveform from gate 114 is an inverted replica of the output 103 from comparator 104. This output waveform is shown in FIG. 17C. The limiting threshold is set by the output 113 of comparator 111 (FIG. 17B) since the output waveform pulse width cannot exceed the limit indicated by dotted line 117 (FIG. 17C), the position of which corresponds to that of the trailing edge 116 (FIG. 17B).

FIG. 18 shows an embodiment of the circuit of FIG. 16 based upon a standard integrated circuit package 118 (for example a Signetics NE 522). The ramp generator 105 is driven by the output of a clock pulse generator 119 which also provides clock pulses to two NAND gates 120 which together operate as the NAND gate 114 of FIG. 16. The limit threshold voltage source 112 comprises a potentiometer which may be adjusted to set the desired limit.

What is claimed is:

1. A switching system comprising at least one pair of semi-conductor switches connected in series across a D.C. supply and providing means for energizing a load, the load being connected to the junction between the pair of switches, a means for returning to the supply current passing through the load when one switch of the pair is conductive, a means for supplying current from the supply to the load when the other switch of the pair is conductive, means for providing a series of "off" command and a series of "on" command signals, the pair of switches being sequentially operable by the series of "on" and "off" command signals, means for providing a delay interval between the sequential application of one of the "off" command signals to one switch of the pair and the subsequent application of one of the "on" command signals to the other switch of the pair, and for preventing simultaneous conduction of each switch of said pair of switches, means for detecting simultaneous conduction of the two series connected switches, and means for increasing the duration of the delay interval when simultaneous conduction is detected.

2. A switching system comprising a pair of semi-conductor switches having inputs, the pair of semi-conductor switches being connected in series across a D.C. supply and providing means for energizing a load, the load being connected to the junction between the pair of switches and to a means for returning to the supply current passing through the load when one switch of the pair is conductive, a means for supplying current from the supply to the load when the other switch of the pair is conductive, means for providing a series of "off" command and a series of "on" command signals, the switches of said pair being sequentially operable by the series of "on" and "off" command signals, a switching signal generator circuit comprising a switching signal generator having an output, a logic circuit having a plurality of outputs and a pulse generator having an output and providing said means for generating said "on" and "off" command singals, means for providing a delay interval between the "off" command to any one switch and the "on" command to the next switch in sequence, means for detecting simultaneous conduction of the two series connected switches, means for increasing the duration of the delay interval when simultaneous conduction is detected, the outputs of the switching signal generator and the pulse generator being connected to the logic circuit, the outputs of the logic circuit being respectively connected to each of the semi-conductor switches, the pulse generator providing means for generating pulses having widths responsive to the means for detecting simultaneous conduction.

3. The switching system according to claim 2, wherein the pulse generator comprises a monostable multivibrator, the multivibrator being triggerable by a series of pulses, the repetition rate of the pulses being twice the frequency of the switching signal generator.

4. A switching system comprising a pair of semi-conductor switches having inputs, the pair of semiconductor switches being connected in series across a D.C. supply and providing means for energizing a load, the load being connected to the junction between the pair of switches, means for returning to the supply current passing through the load when one switch of the pair is conductive, a means for supplying current from the supply to the load when the other switch of the pair is conductive, means for providing a series of "off" command and a series of "on" command signals, the pair of switches being sequentially operable by the series of "on" and "off" command signals, means for providing a delay interval between the "off" command to any one switch and the "on" command to the next switch in sequence, means for detecting simultaneous conduction of the two series switches, means for increasing the delay interval when simultaneous conduction is detected, the switches comprising an output stage of an amplitude modulated transmitter providing means for controlling the supply of current from the D.C. supply to the load, a driver stage, each switch being controllable by the driver stage.

5. A switching system comprising at least two pairs of transistors connected in a bridge configuration across a D.C. source, means for providing a series of "off" command and a series of "on" command signals, the transistors of each pair being sequentially operable by the series of "on" and "off" command signals for energizing a load, each pair of transistors being connected in the output stage of an amplitude modulated transmitter and providing means for controlling the supply of current from the D.C. supply to the load, means for one transistor of each pair receiving the command signals via a first driver circuit and the other transistor of each pair receiving command signals via a second driver circuit, means for providing a delay interval between the "off" command to any one transistor and the "on" command to the next transistor in sequence, means for detecting simultaneous condution of the two transistors of each pair, and means for increasing the duration of the delay interval when simultaneous conduction is detected.

6. The switching system according to claim 5, wherein each driver circuit comprises a pair of field effect transistors having gates and respectively driven by antiphase gate signals, a pair of transformers, each field effect transistor providing means for driving current through the pair of transformers, the transformers coupling the respective driver to the transistor bridge.

7. A switching system comprising a pair of semi-conductor switches connected in series across a D.C. source and providing means for energizing a load, the load being connected to the junction between the pair of switches, means for returning to the supply current passing through the load when one switch of the pair is conductive, a means for supplying current from the supply to the load when the other switch of the pair is conductive, means for providing a series of "off" command and "on" command signals, the pair of switches being sequentially operable by the series of "on" and "off" command signals, and being connected in the output stage of an amplitude modulated transmitter and providing means for controlling the supply of current from the D.C. source to the load, means for providing a delay interval between the "off" command to one switch and the "on" command to the next switch in sequence, means for detecting simultaneous conduction of the two series switches, means for increasing the delay interval when simultaneous conduction is detected, driver stages providing means for controlling the semi-conductor switches, a main modulator providing means for modulating the D.C. source, and an auxiliary modulator providing means for modulating power supplied to the driver stages, the auxiliary modulator comprising a modulating transistor having a control terminal, the control terminal having means for receiving signals from the main modulator, said modulating transistor having means for receiving signals from two independently controllable sources of potential, said sources of potential being controllable for determining the peak and trough auxiliary modulation points of said means for modulating power.

8. The switching system according to claim 1, wherein the means for detecting simultaneous conduction comprises first means for sensing current drawn from the D.C. supply through the switches, second means for sensing current through the load, and means for comparing the sensed currents and for detecting differences between said sensed currents, said differences being representative of simultaneous conduction.

9. The switching system according to claim 8, wherein the first and second means for sensing current comprise current transformer.

10. A switching system comprising a pair of semi-conductor switches, the pair of switches being connected in series across a D.C. supply and providing means for energizing a load, the load being connected to the junction between the pair of switches, a means for returning to the supply current passing through the load when one switch of the pair is conductive, a means for supplying current from the supply to the load when the other switch of the pair is conductive, means for providing a series of "off" command and "on" command signals, the pair of switches being sequentially operable by the series of "on" and "off" command signals, means for providing a delay interval between the "off" command to any one switch of the pair in sequence, a first means for detecting simultaneous conduction of the two series switches, and means for increasing the delay interval when simultaneous conduction is detected, the means for detecting comprising first means for sensing current drawn from the D.C. supply through the switches, said first means for sensing having an output, second means for sensing current through the load and having an output, and means for comparing the sensed currents and providing means for detecting differences between said sensed currents, said means for detecting differences comprising means for full wave rectifying the output of the second means for sensing, means for subtracting the rectified output and the output of the first means for sensing, and a transistor having a control terminal, said means for subtracting having an output, said control terminal being connected for receiving the output of the means for subtracting.

11. The switching system according to claim 10, further comprising a second means for detecting comprising an output stage having a second control terminal connected to sources of reference potential, said means for detecting comprising means for determining maximum and minimum outputs for the output stage, the output of said transistor being connected to the second control terminal and providing means for controlling the output stage between said maximum and minimum outputs.

12. The switching system according to claim 6, further comprising an inductive circuit, a capacitive circuit, an alternately switchable control means for energizing the inductive circuit from a power source having voltage and for transferring energy in the inductive circuit to the capacitive circuit providing means for providing a voltage available at the capacitive circuit by driving the capacitive circuit beyond the voltage of the power source, and means for deriving a gate drive signal from one of said field effect transistors from the voltage available at the capacitive circuit.

13. A switching system comprising a pair of semiconductor switches, the pair of switches being connected in series across a D.C. supply and providing means for energizing a load, the load being connected to the junction between the pair of switches, a means for returning to the supply current passing through the load when one switch of the pair is conductive, a means for supplying current from the supply to the load when the other switch of the pair is conductive, means for providing a series of "off" command and "on" command signals, the pair of switches being sequentially operable by the series of "on" and "off" command signals, means for providing a delay interval between the "off" command to any one switch and the "on" command to the next switch in sequence, means for detecting simultaneous conduction of the two series switches, and means for increasing the duration of the delay interval when simultaneous conduction is detected comprising means for modulating the D.C. supply, the means for modulating the D.C. supply comprising a ramp generator having an output, a switching device having a control terminal and an output, and a driving circuit providing means for providing a pulse width modulated input to the control terminal of the switching device, the driving circuit comprising a comparator having an output comprising a pulse width transfer characteristic and connected for receiving a modulating signal voltage, and an output from the ramp generator, and means for distorting the output of the ramp generator such that the ratio of the modulating signal voltage to comparator output pulse width transfer characteristic is complementary to the comparator output pulse width to switching device output transfer characteristic.

14. A switching system comprising a pair of semiconductor switches, the pair of switches being connected in series across a D.C. supply and providing means for energizing a load, the load being connected to the junction between the pair of switches, a means for returning to the supply current passing through the load when one switch of the pair is conductive, a means for supplying current from the supply to the load when the other switch of the pair is conductive, means for providing a series of "off" command and a series of "on" command signals, the pair of switches being responsive to an input signal, the pair of switches being sequentially operable by the series of "on" and "off" command signals, means for providing a delay interval between the "off" command to any one switch and the "on" command to the next switch in sequence, means for detecting simultaneous conduction of the two switches, and means for increasing the duration of the delay interval when simultaneous conduction is detected comprising a pulse width modulator having an input and providing means for providing an output modulated responsive to an input signal, a voltage reference source having an output, the pulse width modulator comprising a ramp voltage generator having an output, a first comparator having an output and connected for receiving the input signal and the output of the ramp voltage generator, a second comparator having an output and connected for receiving the output of the reference voltage source and the output of the ramp voltage generator, and a gate having an output and connected for receiving the outputs of the first and second comparators, the output of the gate being normally responsive to the output of the first comparator but alternatively responsive to the output of the first comparator in the event that the input signal of the second comparator attains or exceeds a limiting voltage set by the reference voltage source.

* * * * *